(12) United States Patent
French

(10) Patent No.: US 10,882,042 B2
(45) Date of Patent: Jan. 5, 2021

(54) DIGITAL MICROFLUIDIC DEVICES INCLUDING DUAL SUBSTRATES WITH THIN-FILM TRANSISTORS AND CAPACITIVE SENSING

(71) Applicant: E Ink Corporation, Billerica, MA (US)

(72) Inventor: Ian French, Hsinchu (TW)

(73) Assignee: E Ink Corporation, Billerica, MA (US)

( * ) Notice: Subject to any disclaimer, the term of this patent is extended or adjusted under 35 U.S.C. 154(b) by 158 days.

(21) Appl. No.: 16/161,548

(22) Filed: Oct. 16, 2018

(65) Prior Publication Data

US 2019/0111433 A1 Apr. 18, 2019

Related U.S. Application Data

(60) Provisional application No. 62/573,846, filed on Oct. 18, 2017.

(51) Int. Cl.
*B01L 3/00* (2006.01)
*H01L 27/12* (2006.01)
(Continued)

(52) U.S. Cl.
CPC ....... *B01L 3/502792* (2013.01); *B01L 3/5027* (2013.01); *B01L 3/50273* (2013.01); *B01L 3/502784* (2013.01); *G01R 27/2605* (2013.01); *G02B 26/005* (2013.01); *G09G 3/348* (2013.01); *H01L 27/1248* (2013.01); *H01L 27/1251* (2013.01); *H01L 27/1255* (2013.01);
(Continued)

(58) Field of Classification Search
CPC ......... B01L 2400/0427; B01L 3/50273; B01L 3/502792; B01L 3/502784; B01L 3/5027; B01L 2300/161; H01L 27/1251
See application file for complete search history.

(56) References Cited

U.S. PATENT DOCUMENTS 4,573,995 A 3/1986 Chen et al.
4,708,716 A 11/1987 Sibalis
(Continued)

FOREIGN PATENT DOCUMENTS

CN 105665043 A 6/2016
JP H06186575 A 7/1994
(Continued)

OTHER PUBLICATIONS

Abdelgawad, Mohamed et al., "The Digital Revolution: A New Paradigm for Microfluidics", Advanced Materials, vol. 21, pp. 920-925 (2009).
(Continued)

*Primary Examiner* — Caitlyn Mingyun Sun
(74) *Attorney, Agent, or Firm* — Brian D. Bean

(57) ABSTRACT

An active matrix electrowetting on dielectric (AM-EWoD) device including dual substrates with thin-film transistors (TFT) and capacitive sensing. As depicted herein the bottom substrate includes a first plurality of electrodes to propel various droplets through a microfluidic region, while the top substrate includes a second plurality of electrodes that are configured to interrogate the droplets with capacitive sensing. In some embodiments, the top substrate has zones of high-resolution sensing and zones of low-resolution sensing.

17 Claims, 7 Drawing Sheets

(Top TFT array)

(51) Int. Cl.
  *G09G 3/34* (2006.01)
  *G01R 27/26* (2006.01)
  *G02B 26/00* (2006.01)

(52) U.S. Cl.
  CPC . *B01L 2200/0673* (2013.01); *B01L 2300/161* (2013.01); *B01L 2400/0427* (2013.01)

(56) References Cited

U.S. PATENT DOCUMENTS

| | | | |
|---|---|---|---|
| 5,080,646 A | 1/1992 | Theeuwes et al. |
| 5,311,337 A | 5/1994 | McCartney, Jr. |
| 5,930,026 A | 7/1999 | Jacobson |
| 6,118,426 A | 9/2000 | Albert |
| 6,124,851 A | 9/2000 | Jacobson |
| 6,130,773 A | 10/2000 | Jacobson |
| 6,177,921 B1 | 1/2001 | Comiskey |
| 6,232,950 B1 | 5/2001 | Albert |
| 6,241,921 B1 | 6/2001 | Jacobson |
| 6,252,564 B1 | 6/2001 | Albert |
| 6,312,304 B1 | 11/2001 | Duthaler |
| 6,312,971 B1 | 11/2001 | Amundson |
| 6,376,828 B1 | 4/2002 | Comiskey |
| 6,392,786 B1 | 5/2002 | Albert |
| 6,413,790 B1 | 7/2002 | Duthaler |
| 6,422,687 B1 | 7/2002 | Jacobson |
| 6,445,374 B2 | 9/2002 | Albert |
| 6,445,489 B1 | 9/2002 | Jacobson |
| 6,473,072 B1 | 10/2002 | Comiskey |
| 6,480,182 B2 | 11/2002 | Turner |
| 6,498,114 B1 | 12/2002 | Amundson |
| 6,504,524 B1 | 1/2003 | Gates |
| 6,506,438 B2 | 1/2003 | Duthaler |
| 6,512,354 B2 | 1/2003 | Jacobson |
| 6,518,949 B2 | 2/2003 | Drzaic |
| 6,521,489 B2 | 2/2003 | Duthaler et al. |
| 6,531,997 B1 | 3/2003 | Gates |
| 6,535,197 B1 | 3/2003 | Comiskey |
| 6,545,291 B1 | 4/2003 | Amundson |
| 6,639,578 B1 | 10/2003 | Comiskey |
| 6,657,772 B2 | 12/2003 | Loxley |
| 6,664,944 B1 | 12/2003 | Albert |
| D485,294 S | 1/2004 | Albert |
| 6,680,725 B1 | 1/2004 | Jacobson |
| 6,683,333 B2 | 1/2004 | Kazlas |
| 6,704,133 B2 | 3/2004 | Gates |
| 6,710,540 B1 | 3/2004 | Albert |
| 6,724,519 B1 | 4/2004 | Comiskey |
| 6,738,050 B2 | 5/2004 | Comiskey |
| 6,750,473 B2 | 6/2004 | Amundson |
| 6,753,999 B2 | 6/2004 | Zehner |
| 6,816,147 B2 | 11/2004 | Albert |
| 6,819,471 B2 | 11/2004 | Amundson |
| 6,825,068 B2 | 11/2004 | Denis |
| 6,825,829 B1 | 11/2004 | Albert |
| 6,825,970 B2 | 11/2004 | Goenaga |
| 6,831,769 B2 | 12/2004 | Holman |
| 6,842,167 B2 | 1/2005 | Albert |
| 6,842,279 B2 | 1/2005 | Amundson |
| 6,842,657 B1 | 1/2005 | Drzaic |
| 6,865,010 B2 | 3/2005 | Duthaler et al. |
| 6,873,452 B2 | 3/2005 | Tseng |
| 6,900,851 B2 | 5/2005 | Morrison |
| 6,909,532 B2 | 6/2005 | Chung |
| 6,922,276 B2 | 7/2005 | Zhang |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,995,550 B2 | 2/2006 | Jacobson |
| 7,002,728 B2 | 2/2006 | Pullen |
| 7,012,600 B2 | 3/2006 | Zehner |
| 7,012,735 B2 | 3/2006 | Honeyman |
| 7,023,420 B2 | 4/2006 | Comiskey |
| 7,030,412 B1 | 4/2006 | Drzaic et al. |
| 7,030,854 B2 | 4/2006 | Baucom et al. |
| 7,034,783 B2 | 4/2006 | Gates |
| 7,061,166 B2 | 6/2006 | Kuniyasu |
| 7,061,662 B2 | 6/2006 | Chung |
| 7,075,502 B1 | 7/2006 | Drzaic |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson |
| 7,116,466 B2 | 10/2006 | Whitesides |
| 7,119,759 B2 | 10/2006 | Zehner et al. |
| 7,119,772 B2 | 10/2006 | Amundson |
| 7,148,128 B2 | 12/2006 | Jacobson |
| 7,163,612 B2 | 1/2007 | Sterling et al. |
| 7,167,155 B1 | 1/2007 | Albert |
| 7,170,670 B2 | 1/2007 | Webber |
| 7,173,752 B2 | 2/2007 | Doshi et al. |
| 7,176,880 B2 | 2/2007 | Amundson et al. |
| 7,177,066 B2 | 2/2007 | Chung |
| 7,190,008 B2 | 3/2007 | Amundson et al. |
| 7,193,625 B2 | 3/2007 | Danner |
| 7,202,847 B2 | 4/2007 | Gates |
| 7,206,119 B2 | 4/2007 | Honeyman et al. |
| 7,223,672 B2 | 5/2007 | Kazlas et al. |
| 7,230,751 B2 | 6/2007 | Whitesides |
| 7,242,514 B2 | 7/2007 | Chung |
| 7,256,766 B2 | 8/2007 | Albert et al. |
| 7,259,744 B2 | 8/2007 | Arango |
| 7,280,094 B2 | 10/2007 | Albert |
| 7,301,693 B2 | 11/2007 | Chaug |
| 7,304,780 B2 | 12/2007 | Liu |
| 7,304,787 B2 | 12/2007 | Whitesides |
| 7,312,784 B2 | 12/2007 | Baucom |
| 7,312,794 B2 | 12/2007 | Zehner |
| 7,327,346 B2 | 2/2008 | Chung |
| 7,327,511 B2 | 2/2008 | Whitesides |
| 7,347,957 B2 | 3/2008 | Wu |
| 7,349,148 B2 | 3/2008 | Doshi et al. |
| 7,352,353 B2 | 4/2008 | Albert |
| 7,365,394 B2 | 4/2008 | Denis et al. |
| 7,365,733 B2 | 4/2008 | Duthaler |
| 7,382,363 B2 | 6/2008 | Albert et al. |
| 7,388,572 B2 | 6/2008 | Duthaler et al. |
| 7,401,758 B2 | 7/2008 | Liang |
| 7,408,699 B2 | 8/2008 | Wang |
| 7,411,719 B2 | 8/2008 | Paolini, Jr. |
| 7,420,549 B2 | 9/2008 | Jacobson |
| 7,442,587 B2 | 10/2008 | Amundson et al. |
| 7,453,445 B2 | 11/2008 | Amundson |
| 7,471,274 B2 | 12/2008 | Kim |
| 7,492,339 B2 | 2/2009 | Amundson |
| 7,492,497 B2 | 2/2009 | Paolini, Jr. |
| 7,528,822 B2 | 5/2009 | Amundson |
| 7,535,624 B2 | 5/2009 | Amundson et al. |
| 7,545,358 B2 | 6/2009 | Gates |
| 7,551,346 B2 | 6/2009 | Fazel |
| 7,554,712 B2 | 6/2009 | Patry et al. |
| 7,560,004 B2 | 7/2009 | Pereira |
| 7,583,251 B2 | 9/2009 | Arango |
| 7,583,427 B2 | 9/2009 | Danner |
| 7,598,173 B2 | 10/2009 | Ritenour |
| 7,602,374 B2 | 10/2009 | Zehner |
| 7,605,799 B2 | 10/2009 | Amundson et al. |
| 7,612,760 B2 | 11/2009 | Kawai |
| 7,636,191 B2 | 12/2009 | Duthaler |
| 7,649,674 B2 | 1/2010 | Danner |
| 7,667,886 B2 | 2/2010 | Danner |
| 7,672,040 B2 | 3/2010 | Sohn |
| 7,679,599 B2 | 3/2010 | Kawai |
| 7,679,813 B2 | 3/2010 | Liang |
| 7,679,814 B2 | 3/2010 | Paolini, Jr. |
| 7,683,606 B2 | 3/2010 | Kang |
| 7,688,297 B2 | 3/2010 | Zehner |
| 7,688,497 B2 | 3/2010 | Danner |
| 7,705,824 B2 | 4/2010 | Baucom et al. |
| 7,729,039 B2 | 6/2010 | LeCain et al. |
| 7,733,311 B2 | 6/2010 | Amundson |
| 7,733,335 B2 | 6/2010 | Zehner |
| 7,785,988 B2 | 8/2010 | Amundson |
| 7,787,169 B2 | 8/2010 | Abramson et al. |

(56) References Cited

U.S. PATENT DOCUMENTS

| | | |
|---|---|---|
| 7,830,592 B1 | 11/2010 | Sprague |
| 7,839,564 B2 | 11/2010 | Whitesides et al. |
| 7,843,626 B2 | 11/2010 | Amundson et al. |
| 7,859,637 B2 | 12/2010 | Amundson et al. |
| 7,859,742 B1 | 12/2010 | Chiu |
| 7,880,958 B2 | 2/2011 | Zang |
| 7,893,435 B2 | 2/2011 | Kazlas et al. |
| 7,898,717 B2 | 3/2011 | Patry |
| 7,905,977 B2 | 3/2011 | Qi |
| 7,952,557 B2 | 5/2011 | Amundson |
| 7,956,841 B2 | 6/2011 | Albert |
| 7,957,053 B2 | 6/2011 | Honeyman |
| 7,982,479 B2 | 7/2011 | Wang |
| 7,986,450 B2 | 7/2011 | Cao |
| 7,999,787 B2 | 8/2011 | Amundson |
| 8,009,344 B2 | 8/2011 | Danner |
| 8,009,348 B2 | 8/2011 | Zehner |
| 8,027,081 B2 | 9/2011 | Danner |
| 8,049,947 B2 | 11/2011 | Danner |
| 8,064,962 B2 | 11/2011 | Wilcox et al. |
| 8,072,675 B2 | 12/2011 | Lin |
| 8,077,141 B2 | 12/2011 | Duthaler |
| 8,089,453 B2 | 1/2012 | Comiskey |
| 8,120,836 B2 | 2/2012 | Lin |
| 8,125,501 B2 | 2/2012 | Amundson |
| 8,139,050 B2 | 3/2012 | Jacobson |
| 8,149,228 B2 | 4/2012 | Lin et al. |
| 8,159,636 B2 | 4/2012 | Sun |
| 8,159,644 B2 | 4/2012 | Takatori |
| 8,173,000 B1 | 5/2012 | Hadwen et al. |
| 8,174,490 B2 | 5/2012 | Whitesides |
| 8,208,193 B2 | 6/2012 | Patry |
| 8,237,892 B1 | 8/2012 | Sprague |
| 8,238,021 B2 | 8/2012 | Sprague |
| 8,243,013 B1 | 8/2012 | Sprague |
| 8,274,472 B1 | 9/2012 | Wang |
| 8,289,250 B2 | 10/2012 | Zehner |
| 8,300,006 B2 | 10/2012 | Zhou |
| 8,305,341 B2 | 11/2012 | Arango |
| 8,314,784 B2 | 11/2012 | Ohkami |
| 8,319,759 B2 | 11/2012 | Jacobson |
| 8,339,711 B2 * | 12/2012 | Hadwen .................. B01L 7/52 359/665 |
| 8,362,488 B2 | 1/2013 | Chaug |
| 8,373,211 B2 | 2/2013 | Amundson |
| 8,373,649 B2 | 2/2013 | Low |
| 8,384,658 B2 | 2/2013 | Albert |
| 8,389,381 B2 | 3/2013 | Amundson |
| 8,395,836 B2 | 3/2013 | Lin |
| 8,419,273 B2 | 4/2013 | Hadwen et al. |
| 8,437,069 B2 | 5/2013 | Lin |
| 8,441,414 B2 | 5/2013 | Lin |
| 8,456,414 B2 | 6/2013 | Lin |
| 8,456,589 B1 | 6/2013 | Sprague |
| 8,462,102 B2 | 6/2013 | Wong |
| 8,498,042 B2 | 7/2013 | Danner |
| 8,514,168 B2 | 8/2013 | Chung |
| 8,525,966 B2 | 9/2013 | Takatori |
| 8,529,743 B2 | 9/2013 | Kim et al. |
| 8,537,105 B2 | 9/2013 | Chiu |
| 8,547,111 B2 | 10/2013 | Hadwen et al. |
| 8,547,628 B2 | 10/2013 | Wu |
| 8,553,012 B2 | 10/2013 | Baucom |
| 8,558,783 B2 | 10/2013 | Wilcox |
| 8,558,785 B2 | 10/2013 | Zehner |
| 8,558,786 B2 | 10/2013 | Lin |
| 8,558,855 B2 | 10/2013 | Sprague |
| 8,576,162 B2 | 11/2013 | Kang |
| 8,576,164 B2 | 11/2013 | Sprague |
| 8,576,259 B2 | 11/2013 | Lin |
| 8,593,396 B2 | 11/2013 | Amundson |
| 8,605,032 B2 | 12/2013 | Liu |
| 8,610,988 B2 | 12/2013 | Zehner |
| 8,643,595 B2 | 2/2014 | Chung |
| 8,653,832 B2 * | 2/2014 | Hadwen .................. G09G 3/00 324/649 |
| 8,654,571 B2 | 2/2014 | John et al. |
| 8,665,206 B2 | 3/2014 | Lin |
| 8,681,191 B2 | 3/2014 | Yang |
| 8,714,780 B2 | 5/2014 | Ho |
| 8,728,266 B2 | 5/2014 | Danner |
| 8,730,153 B2 | 5/2014 | Sprague |
| 8,743,077 B1 | 6/2014 | Sprague |
| 8,754,859 B2 | 6/2014 | Gates |
| 8,764,958 B2 | 7/2014 | Wang |
| 8,797,258 B2 | 8/2014 | Sprague |
| 8,797,633 B1 | 8/2014 | Sprague |
| 8,797,636 B2 | 8/2014 | Yang |
| 8,810,525 B2 | 8/2014 | Sprague |
| 8,810,882 B2 * | 8/2014 | Heikenfeld .......... G02B 26/004 345/107 |
| 8,815,070 B2 | 8/2014 | Wang et al. |
| 8,828,336 B2 | 9/2014 | Hadwen et al. |
| 8,830,560 B2 | 9/2014 | Danner |
| 8,853,645 B2 | 10/2014 | Okada et al. |
| 8,891,155 B2 | 11/2014 | Danner |
| 8,928,562 B2 | 1/2015 | Gates |
| 8,928,641 B2 | 1/2015 | Chiu |
| 8,958,044 B2 | 2/2015 | Takatori |
| 8,969,886 B2 | 3/2015 | Amundson |
| 8,976,444 B2 | 3/2015 | Zhang |
| 8,980,075 B2 | 3/2015 | Cheng et al. |
| 8,994,705 B2 | 3/2015 | Jacobson |
| 9,013,394 B2 | 4/2015 | Lin |
| 9,019,197 B2 | 4/2015 | Lin |
| 9,019,198 B2 | 4/2015 | Lin |
| 9,019,318 B2 | 4/2015 | Sprague |
| 9,025,234 B2 | 5/2015 | Lin |
| 9,025,238 B2 | 5/2015 | Chan |
| 9,030,374 B2 | 5/2015 | Sprague |
| 9,082,352 B2 | 7/2015 | Cheng |
| 9,140,952 B2 | 9/2015 | Sprague |
| 9,147,364 B2 | 9/2015 | Wu |
| 9,152,003 B2 | 10/2015 | Danner |
| 9,152,004 B2 | 10/2015 | Paolini, Jr. |
| 9,171,508 B2 | 10/2015 | Sprague |
| 9,201,279 B2 | 12/2015 | Wu |
| 9,216,414 B2 * | 12/2015 | Chu .................... B01J 19/0046 |
| 9,218,773 B2 | 12/2015 | Sun |
| 9,223,164 B2 | 12/2015 | Lai |
| 9,224,338 B2 | 12/2015 | Chan |
| 9,224,342 B2 | 12/2015 | Sprague |
| 9,224,344 B2 | 12/2015 | Chung |
| 9,230,492 B2 | 1/2016 | Harrington |
| 9,251,736 B2 | 2/2016 | Lin |
| 9,262,973 B2 | 2/2016 | Wu |
| 9,269,311 B2 | 2/2016 | Amundson |
| 9,285,648 B2 | 3/2016 | Liu |
| 9,299,294 B2 | 3/2016 | Lin |
| 9,310,661 B2 | 4/2016 | Wu |
| 9,373,289 B2 | 6/2016 | Sprague |
| 9,390,066 B2 | 7/2016 | Smith |
| 9,390,661 B2 | 7/2016 | Chiu |
| 9,412,314 B2 | 8/2016 | Amundson |
| 9,419,024 B2 | 8/2016 | Amundson |
| 9,454,057 B2 | 9/2016 | Wu |
| 9,458,543 B2 | 10/2016 | Hadwen |
| 9,460,666 B2 | 10/2016 | Sprague |
| 9,495,918 B2 | 11/2016 | Harrington |
| 9,501,981 B2 | 11/2016 | Lin |
| 9,513,743 B2 | 12/2016 | Sjodin et al. |
| 9,514,667 B2 | 12/2016 | Lin |
| 9,529,240 B2 | 12/2016 | Paolini, Jr. |
| 9,542,895 B2 | 1/2017 | Gates |
| 9,564,088 B2 | 2/2017 | Wilcox et al. |
| 9,582,041 B2 | 2/2017 | Cheng |
| 9,612,502 B2 | 4/2017 | Danner |
| 9,620,048 B2 | 4/2017 | Sim |
| 9,620,066 B2 | 4/2017 | Bishop |
| 9,620,067 B2 | 4/2017 | Harrington |
| 9,632,373 B2 | 4/2017 | Huang |
| 9,666,142 B2 | 5/2017 | Hung |
| 9,671,635 B2 | 6/2017 | Paolini, Jr. |

(56) References Cited

U.S. PATENT DOCUMENTS

| | | | |
|---|---|---|---|
| 9,672,766 B2 | 6/2017 | Sjodin | |
| 9,679,185 B2* | 6/2017 | Chin | G06K 9/0002 |
| 9,691,333 B2 | 6/2017 | Cheng | |
| 9,721,495 B2 | 8/2017 | Harrington | |
| 9,778,500 B2 | 10/2017 | Gates | |
| 9,792,861 B2 | 10/2017 | Chang | |
| 9,792,862 B2 | 10/2017 | Hung | |
| 9,815,056 B2 | 11/2017 | Wu et al. | |
| 9,841,653 B2 | 12/2017 | Wu | |
| 9,921,451 B2 | 3/2018 | Telfer et al. | |
| 9,966,018 B2 | 5/2018 | Gates | |
| 10,037,735 B2 | 7/2018 | Amundson | |
| 10,048,563 B2 | 8/2018 | Paolini, Jr. | |
| 10,048,564 B2 | 8/2018 | Paolini, Jr. | |
| 10,190,743 B2 | 1/2019 | Hertel et al. | |
| 10,229,641 B2 | 3/2019 | Yang | |
| 10,319,313 B2 | 6/2019 | Harris | |
| 2002/0060321 A1 | 5/2002 | Kazlas | |
| 2002/0090980 A1 | 7/2002 | Wilcox et al. | |
| 2003/0102858 A1 | 6/2003 | Jacobson | |
| 2004/0085619 A1 | 5/2004 | Wu | |
| 2004/0105036 A1 | 6/2004 | Danner et al. | |
| 2004/0119681 A1 | 6/2004 | Albert et al. | |
| 2004/0246562 A1 | 12/2004 | Chung | |
| 2005/0122306 A1 | 6/2005 | Wilcox et al. | |
| 2005/0122563 A1 | 6/2005 | Honeyman et al. | |
| 2005/0253777 A1 | 11/2005 | Zehner | |
| 2006/0255322 A1 | 11/2006 | Wu | |
| 2007/0052757 A1 | 3/2007 | Jacobson | |
| 2007/0091418 A1 | 4/2007 | Danner | |
| 2007/0103427 A1 | 5/2007 | Zhou et al. | |
| 2007/0176912 A1 | 8/2007 | Beames | |
| 2007/0285385 A1 | 12/2007 | Albert | |
| 2008/0024429 A1 | 1/2008 | Zehner | |
| 2008/0024482 A1 | 1/2008 | Gates | |
| 2008/0136774 A1 | 6/2008 | Harris | |
| 2008/0154179 A1 | 6/2008 | Cantor et al. | |
| 2008/0303780 A1 | 12/2008 | Sprague | |
| 2009/0122389 A1 | 5/2009 | Whitesides | |
| 2009/0174651 A1 | 7/2009 | Jacobson | |
| 2009/0315044 A1 | 12/2009 | Amundson | |
| 2009/0322721 A1 | 12/2009 | Zehner | |
| 2010/0177396 A1 | 7/2010 | Lin | |
| 2010/0194733 A1 | 8/2010 | Lin | |
| 2010/0194789 A1 | 8/2010 | Lin | |
| 2010/0220121 A1 | 9/2010 | Zehner | |
| 2010/0225611 A1 | 9/2010 | Lee et al. | |
| 2010/0265561 A1 | 10/2010 | Gates et al. | |
| 2011/0063314 A1 | 3/2011 | Chiu | |
| 2011/0140744 A1 | 6/2011 | Kazlas | |
| 2011/0175875 A1 | 7/2011 | Lin | |
| 2011/0187683 A1 | 8/2011 | Wilcox | |
| 2011/0193840 A1 | 8/2011 | Amundson | |
| 2011/0193841 A1 | 8/2011 | Amundson | |
| 2011/0199671 A1 | 8/2011 | Amundson | |
| 2011/0221740 A1 | 9/2011 | Yang | |
| 2011/0292319 A1 | 12/2011 | Cole | |
| 2012/0001957 A1 | 1/2012 | Liu | |
| 2012/0098740 A1 | 4/2012 | Chiu | |
| 2012/0273702 A1 | 11/2012 | Culbertson et al. | |
| 2012/0293858 A1 | 11/2012 | Telfer | |
| 2013/0063333 A1 | 3/2013 | Arango | |
| 2013/0146459 A1 | 6/2013 | Bazant et al. | |
| 2013/0161193 A1* | 6/2013 | Jacobs | B01L 3/502792 204/604 |
| 2013/0194250 A1 | 8/2013 | Amundson | |
| 2013/0249782 A1 | 9/2013 | Wu | |
| 2014/0009817 A1 | 1/2014 | Wilcox et al. | |
| 2014/0078024 A1 | 3/2014 | Paolini, Jr. | |
| 2014/0192000 A1 | 7/2014 | Hung | |
| 2014/0204012 A1 | 7/2014 | Wu | |
| 2014/0210701 A1 | 7/2014 | Wu | |
| 2014/0240210 A1 | 8/2014 | Wu | |
| 2014/0253425 A1 | 9/2014 | Zalesky | |
| 2014/0293398 A1 | 10/2014 | Wang | |
| 2015/0097877 A1 | 4/2015 | Lin | |
| 2015/0261057 A1 | 9/2015 | Harris | |
| 2015/0262255 A1 | 9/2015 | Khajehnouri | |
| 2015/0262551 A1 | 9/2015 | Zehner | |
| 2015/0378235 A1 | 12/2015 | Lin | |
| 2016/0077375 A1 | 3/2016 | Lin | |
| 2016/0103380 A1 | 4/2016 | Kayal | |
| 2016/0140910 A1 | 5/2016 | Amundson | |
| 2016/0178890 A1* | 6/2016 | Massard | G02B 26/005 345/214 |
| 2016/0180777 A1 | 6/2016 | Lin | |
| 2016/0312165 A1 | 10/2016 | Lowe, Jr. et al. | |
| 2017/0104009 A1* | 4/2017 | Peng | H01L 27/1259 |
| 2017/0141777 A1* | 5/2017 | Wu | H03K 19/20 |
| 2018/0110975 A1 | 4/2018 | Ivanoff et al. | |
| 2018/0271799 A1 | 9/2018 | Liu et al. | |

FOREIGN PATENT DOCUMENTS

| | | |
|---|---|---|
| JP | 2008145998 A | 6/2008 |
| JP | 2013076739 A | 4/2013 |
| KR | 20070041934 A | 4/2007 |
| TW | 200916823 A | 4/2009 |
| WO | 1999067678 A2 | 12/1999 |
| WO | 2000005704 A1 | 2/2000 |
| WO | 2000036560 A1 | 6/2000 |
| WO | 2000038000 A1 | 6/2000 |

OTHER PUBLICATIONS

Zhao, Ya-Pu et al., "Fundamentals and Applications of Electrowetting: A Critical Review", Rev. Adhesion Adhesives, vol. 1, No. 1, pp. 114-174 (2013).

Kalsi, S. et. al., "Rapid and sensitive detection of antibiotic resistance on a programmable digital microfluidic platform", Lab on a Chip, Issue No. 14 (2015).

Choi, Kihwan et al., "Digital Microfluidicsc", Annu. Rev. Anal. Chem. 5:413-40 (2012).

Dong, Tao et al., "Capacitance Variation Induced by Microfluidic Two-Phase Flow across Insulated Interdigital Electrodes in Lab-On-Chip Devices", Sensors, 15, pp. 2694-2708 (2015).

Geronimo, G. De et al., "Front-end electronics for imaging detectors", Nuclear Instrumentsand Methods in Physics Research A, 471 pp. 192-199, (2001).

Korean International Patent Office, PCT/US2018/056037, International Search Report and Written Opinion, dated Feb. 8, 2019.

Fouillet, Y. et al., "EWOD Digital Microfluidics for Lab on a Chip", International Conference on Nanochannels, Microchannels, and Minichannels, Paper No. ICNMM2006-96020, pp. 1255-1264, (Sep. 2008).

Korean Intellectual Property Office, PCT/US2019/056173, International Search Report and Written Opinion, dated Jan. 31, 2020.

Panchagnula, R. et al., "Transdermal delivery of naloxone: skin permeation, pharmacokinetic, irritancy and stability studies", International Journal of Pharmaceutics, 293(1-2), pp. 213-223, Apr. 11, 2005. Apr. 11, 2005.

Nisar, A. et al., "MEMS-based micropumps in drug delivery and biomedical applications", Sensors and Actuators B: Chemical, vol. 130, Issue 2, pp. 917-942, Mar. 28, 2008. Mar. 28, 2008.

* cited by examiner (Bottom TFT array)

(Top TFT array)

DIGITAL MICROFLUIDIC DEVICES INCLUDING DUAL SUBSTRATES WITH THIN-FILM TRANSISTORS AND CAPACITIVE SENSING

RELATED APPLICATIONS

This application claims priority to U.S. Provisional Patent Application No. 62/573,846, filed Oct. 18, 2017. All patents and patent applications referenced in this specification are incorporated by reference in their entireties.

BACKGROUND

Digital microfluidic devices use independent electrodes to propel, split, and join droplets in a confined environment, thereby providing a "lab-on-a-chip." Digital microfluidic devices are alternatively referred to as electrowetting on dielectric, or "EWoD," to further differentiate the method from competing microfluidic systems that rely on electrophoretic flow and/or micropumps. A 2012 review of the electrowetting technology was provided by Wheeler in "Digital Microfluidics," *Annu. Rev. Anal. Chem.* 2012, 5:413-40, which is incorporated herein by reference in its entirety. The technique allows sample preparation, assays, and synthetic chemistry to be performed with tiny quantities of both samples and reagents. In recent years, controlled droplet manipulation in microfluidic cells using electrowetting has become commercially-viable; and there are now products available from large life science companies, such as Oxford Nanopore.

Most of the literature reports on EWoD involve so-called "passive matrix" devices (a.k.a. "segmented" devices), whereby ten to twenty electrodes are directly driven with a controller. While segmented devices are easy to fabricate, the number of electrodes is limited by space and driving constraints. Accordingly, it is not possible to perform massive parallel assays, reactions, etc. in passive matrix devices. In comparison, "active matrix" devices (a.k.a. active matrix EWoD, a.k.a. AM-EWoD) devices can have many thousands, hundreds of thousands or even millions of addressable electrodes. The electrodes are typically switched by thin-film transistors (TFTs) and droplet motion is programmable so that AM-EWoD arrays can be used as general purpose devices that allow great freedom for controlling multiple droplets and executing simultaneous analytical processes.

Because of the restrictive requirements on the electric field leakage, most advanced AM-EWoD devices are constructed from polycrystalline silicon (a.k.a. polysilicon, a.k.a. poly-Si). However, polysilicon fabrication is substantially more expensive than amorphous silicon fabrication, i.e., the type used in mass-produced active matrix TFTs for the LCD display industry. Polysilicon fabrication processes are more expensive because there are unique handling and fabrication steps for working with polysilicon. There are also fewer facilities worldwide that are configured to fabricate devices from polysilicon. However, because of the improved functionality of polysilicon, Sharp Corporation has been able to achieve AM-EWoD devices that include propulsion, sensing, and heating capabilities on a single active matrix. See, e.g., U.S. Pat. Nos. 8,419,273, 8,547,111, 8,654,571, 8,828,336, 9,458,543, all of which are incorporated herein by reference in their entireties. An example of a complex poly-Si AM-EWoD is shown in FIG. 1.

While poly-Si fabrication techniques allow implementation of complex AM-EWoD devices, the costs of poly-Si device production, combined with a global shortage of suitable fabrication facilities, has prevented the AM-EWoD technology from becoming widely available. There is a need for different designs that can take advantage of existing amorphous silicon fabrication capacity. Such devices could be produced at lower cost, and in great quantities, making them ideal for commonplace diagnostic testing, such as immunoassays.

SUMMARY OF INVENTION

The invention addresses the shortcomings of the prior art by providing an alternate architecture for an AM-EWoD that is well-suited for construction from amorphous silicon substrates. In one instance, the invention provides a digital microfluidic device, including a first substrate, a second substrate, a spacer, and first and second controllers. The first substrate includes a first plurality of electrodes coupled to a first set of thin-film-transistors, and includes a first dielectric layer covering both the first plurality of electrodes and the first set of thin-film-transistors. The second substrate includes a second plurality of electrodes coupled to a second set of thin-film-transistors, and includes a second dielectric layer covering both the second plurality of electrodes and the second set of thin-film-transistors. The spacer separates the first and second substrates, and creates a microfluidic region between the first and second substrates. The first controller is operatively coupled to the first set of thin-film-transistors and configured to provide a propulsion voltage to at least a portion of the first plurality of electrodes, while the second controller is operatively coupled to the second set of thin-film-transistors and configured to determine a capacitance between at least one of the second plurality of electrodes and a drive electrode. In some embodiments, the first dielectric layer is hydrophobic, and in other embodiments, the second dielectric layer is hydrophobic. In preferred embodiments, the first plurality of electrodes are arranged in an array, for example with at least 25 electrodes per linear centimeter. In some embodiments, the second plurality of electrodes are interdigitated with the drive electrode. In some embodiments, a signal source is coupled to the drive electrode and configured to provide a time-varying voltage to the drive electrode. In some embodiments the second substrate includes at least one light-transmissive region, which may be, e.g., at least 10 $mm^2$ in area. The digital microfluidic device may be constructed from amorphous or polysilicon.

In some embodiments, a digital microfluidic device will have two areas of different electrode densities, i.e., a high density (a.k.a. "high-res") area, and a low density (a.k.a. "low-res") area for the sensor electrode side. Such a design will allow a user to perform particle interrogation (i.e., capacitive sensing) to determine composition or size in one portion of the device, and then simply monitor the location or presence of particles in another portion of the device. Overall, such a configuration simplifies the fabrication of a device while also simplifying the data handling associated with the sensing functions.

DETAILED DESCRIPTION

As indicated above, the present invention provides an active matrix electrowetting on dielectric (AM-EWoD) device including dual substrates with thin-film transistors (TFT) and capacitive sensing. As depicted herein the "bottom" substrate includes a plurality of electrodes to propel various droplets through a microfluidic region. The "top" substrate includes a plurality of electrodes to provide a signal and to detect the presence and/or size and/or composition of a droplet with capacitive sensing. The use of "top" and "bottom" is merely a convention as the locations of the two substrates can be switched, and the devices can be oriented in a variety of ways, for example, the top and bottom plates can be roughly parallel while the overall device is oriented so that the substrates are normal to a work surface (as opposed to parallel to the work surface as shown in the figures). The top or the bottom substrate may include additional functionality, such as resistive heating and/or temperature sensing. Because the devices incorporate TFT-based sensors, the devices have much higher sensitivity and resolution than known passive devices. Additionally, because both of the electrodes needed for capacitive sensing are on the same substrate, the top and bottom electrodes do not need to be aligned, and the sensing pixels can be of different sizes or configurations as compared to the propulsion electrodes. Additionally, the designs can be implemented with amorphous silicon, thereby reducing the cost of production to the point that the devices can be disposable. It is also possible to use a-Si TFTs for the bottom plate to benefit from their higher operation voltage, and poly-Si TFTs on the top plate for higher sensitivity sensing.

Figure 1:
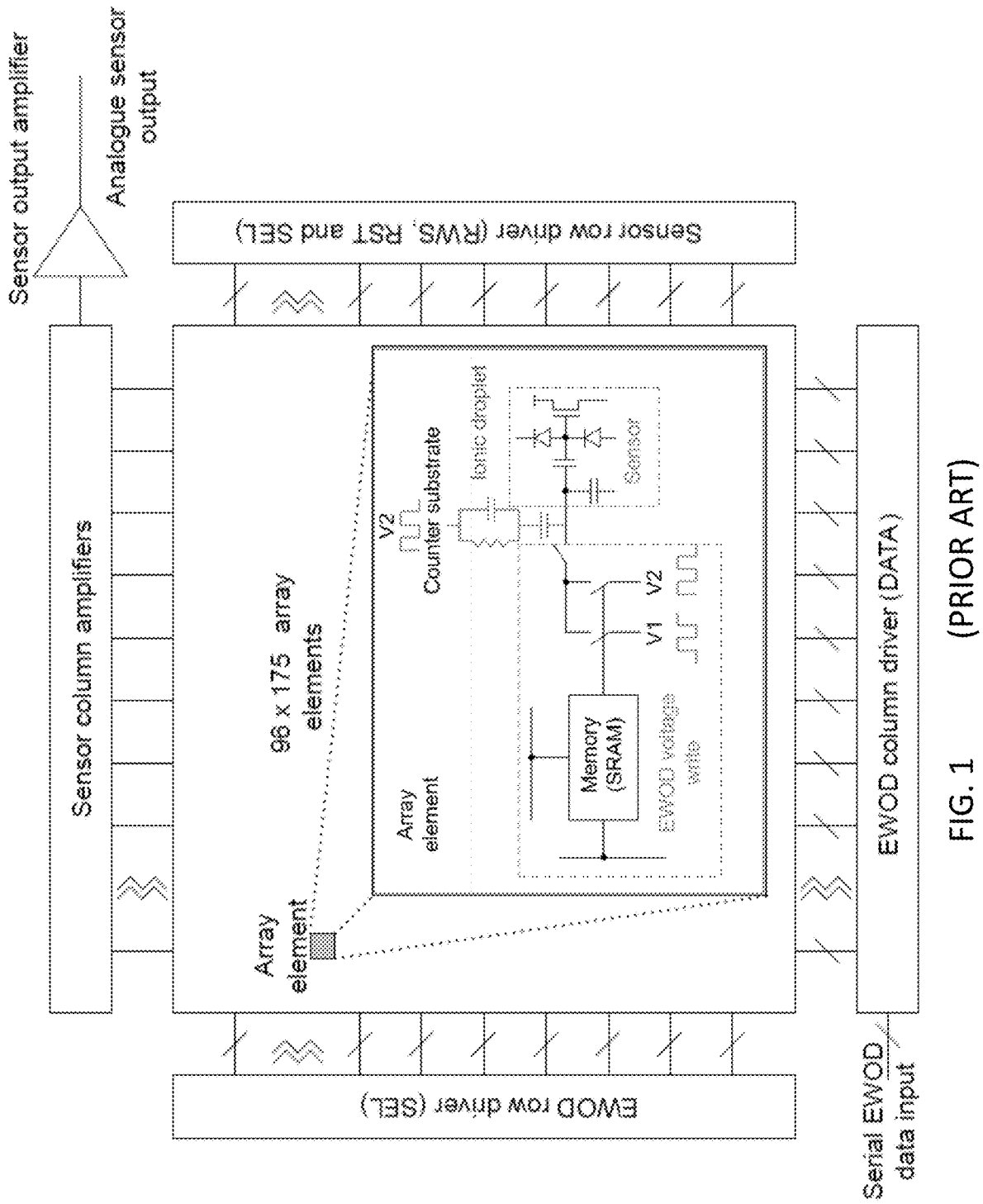
FIG. 1 shows a prior art EWoD device including both propulsion and sensing on the same active matrix.
Figure 2:
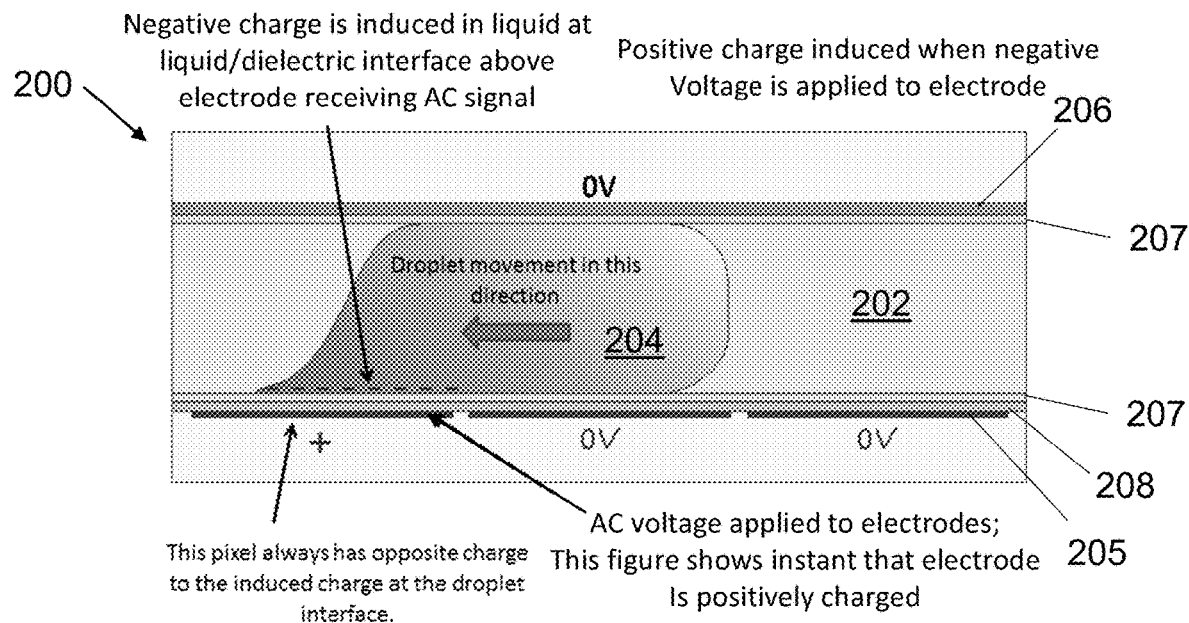
FIG. 2 depicts the movement of an aqueous-phase droplet between adjacent electrodes by providing differing charge states on adjacent electrodes.

The fundamental operation of an EWoD device is illustrated in the sectional image of FIG. 2. The EWoD 200 includes a cell filled with an oil 202 and at least one aqueous droplet 204. The cell gap is typically in the range 50 to 200 μm, but the gap can be larger. In a basic configuration, as shown in FIG. 2, a plurality of propulsion electrodes 205 are disposed on one substrate and a singular top electrode 206 is disposed on the opposing surface. The cell additionally includes hydrophobic coatings 207 on the surfaces contacting the oil layer, as well as a dielectric layer 208 between the propulsion electrodes 205 and the hydrophobic coating 207. (The upper substrate may also include a dielectric layer, but it is not shown in FIG. 2). The hydrophobic layer prevents the droplet from wetting the surface. When no voltage differential is applied between adjacent electrodes, the droplet will maintain a spheroidal shape to minimize contact with the hydrophobic surfaces (oil and hydrophobic layer). Because the droplets do not wet the surface, they are less likely to contaminate the surface or interact with other droplets except when that behavior is desired.

While it is possible to have a single layer for both the dielectric and hydrophobic functions, such layers typically require thick inorganic layers (to prevent pinholes) with resulting low dielectric constants, thereby requiring more than 100V for droplet movement. To achieve low voltage actuation, it is better to have a thin inorganic layer for high capacitance and to be pinhole free, topped by a thin organic hydrophobic layer. With this combination it is possible to have electrowetting operation with voltages in the range +/−10 to +/−50V, which is in the range that can be supplied by conventional TFT arrays.

When a voltage differential is applied between adjacent electrodes, the voltage on one electrode attracts opposite charges in the droplet at the dielectric-to-droplet interface, and the droplet moves toward this electrode, as illustrated in FIG. 2. The voltages needed for acceptable droplet propulsion depend on the properties of the dielectric and hydrophobic layers. AC driving is used to reduce degradation of the droplets, dielectrics, and electrodes by various electrochemistries. Operational frequencies for EWoD can be in the range 100 Hz to 1 MHz, but lower frequencies of 1 kHz or lower are preferred for use with TFTs that have limited speed of operation.

Figure 3:
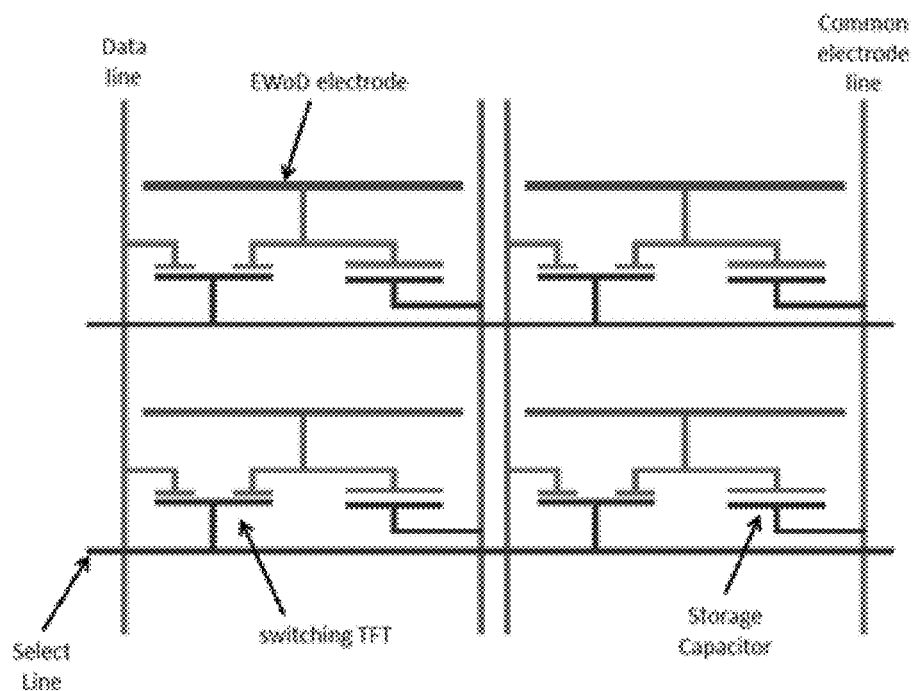
FIG. 3 shows a TFT architecture for a plurality of propulsion electrodes of an EWoD device of the invention.

As shown in FIG. 2, the top electrode 206 is a single conducting layer normally set to zero volts or a common voltage value (VCOM) to take into account offset voltages on the propulsion electrodes 205 due to capacitive kickback from the TFTs that are used to switch the voltage on the electrodes (see FIG. 3). The top electrode can also have a square wave applied to increase the voltage across the liquid. Such an arrangement allows lower propulsion voltages to be used for the TFT connected propulsion electrodes 205 because the top plate voltage 206 is additional to the voltage supplied by the TFT.

As shown in FIG. 3, an active matrix of propulsion electrodes can be arranged to be driven with data and gate (select) lines much like an active matrix in a liquid crystal display. The gate (select) lines are scanned for line-at-a time addressing, while the data lines carry the voltage to be transferred to propulsion electrodes for electrowetting operation. If no movement is needed, or if a droplet is meant to move away from a propulsion electrode, then 0V will be applied to that (non-target) propulsion electrode. If a droplet is meant to move toward a propulsion electrode, an AC voltage will be applied to that (target) propulsion electrode.

Figure 4:
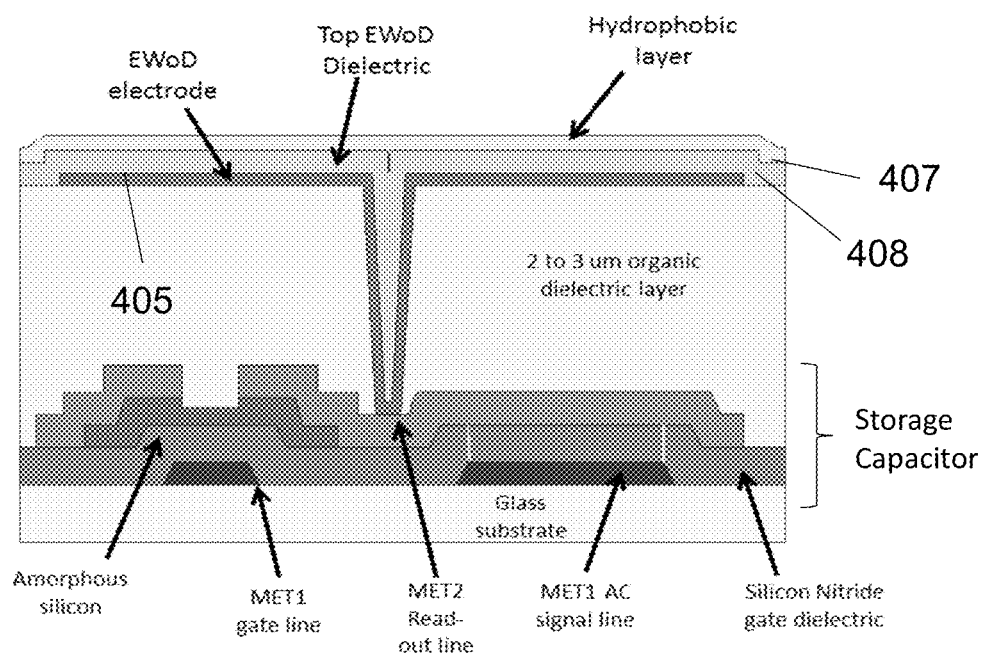
FIG. 4 is a schematic diagram of a portion of the first substrate, including a propulsion electrode, a thin film transistor, a storage capacitor, a dielectric layer, and a hydrophobic layer.

The architecture of an amorphous silicon, TFT-switched, propulsion electrode is shown in FIG. 4. The dielectric 408 must be thin enough and have a dielectric constant compatible with low voltage AC driving, such as available from conventional image controllers for LCD displays. For example, the dielectric layer may comprise a layer of approximately 20-40 nm $SiO_2$ topped over-coated with 200-400 nm plasma-deposited silicon nitride. Alternatively, the dielectric may comprise atomic-layer-deposited $Al_2O_3$ between 2 and 100 nm thick, preferably between 20 and 60 nm thick. The TFT is constructed by creating alternating layers of differently-doped a-Si structures along with various electrode lines, with methods know to those of skill in the art. The hydrophobic layer 407 can be constructed from materials such as Teflon® AF (Sigma-Aldrich, Milwaukee, Wis.) and FlurorPel™ coatings from Cytonix (Beltsville, Md.), which can be spin coated over the dielectric layer 408.

Figure 6:
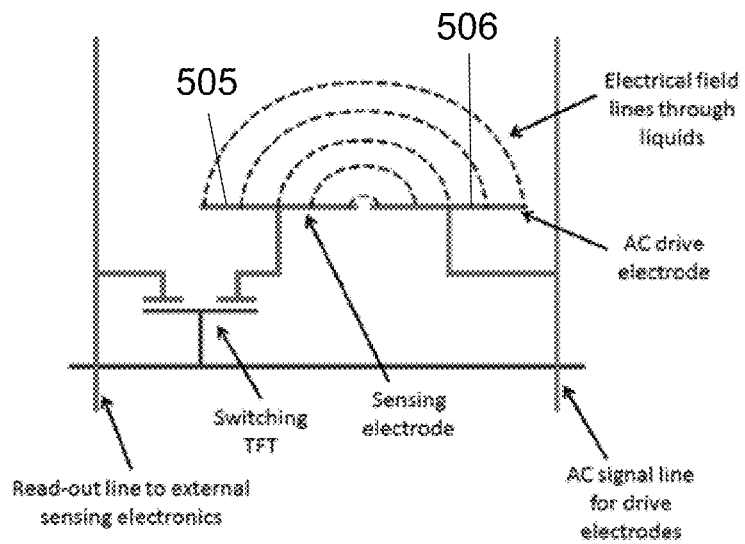
FIG. 6 shows a TFT architecture for a sensing electrode and a drive electrode configured for capacitive sensing and evaluation of microfluidic droplets.

In the invention, a second substrate with TFT functionality is constructed to provide capacitive sensing capabilities, and the two layers are separated with a spacer that creates a microfluidic region between the two layers. Capacitive sensing of droplets uses two electrodes, as shown in FIG. 6. Typically, an AC signal is applied to a driving electrode 506, whereby the AC signal produces a capacitively-coupled voltage on a nearby sensing electrode 505. The capacitively-coupled signal is measured by external circuitry, and changes in the signal are indicative of the material between the drive electrode 506 and the sensing electrode 505. For example, the coupled voltage will be obviously different depending on whether oil 202 or an aqueous droplet 204 is between the electrodes because of the differences in the relative permittivity between the materials. (Silicone oil has a relative permittivity of $\varepsilon_r=2.5$, ethanol has a relative permittivity of $\varepsilon_r=24$, and water has a relative permittivity of $\varepsilon_r=80$.)

Figure 5:
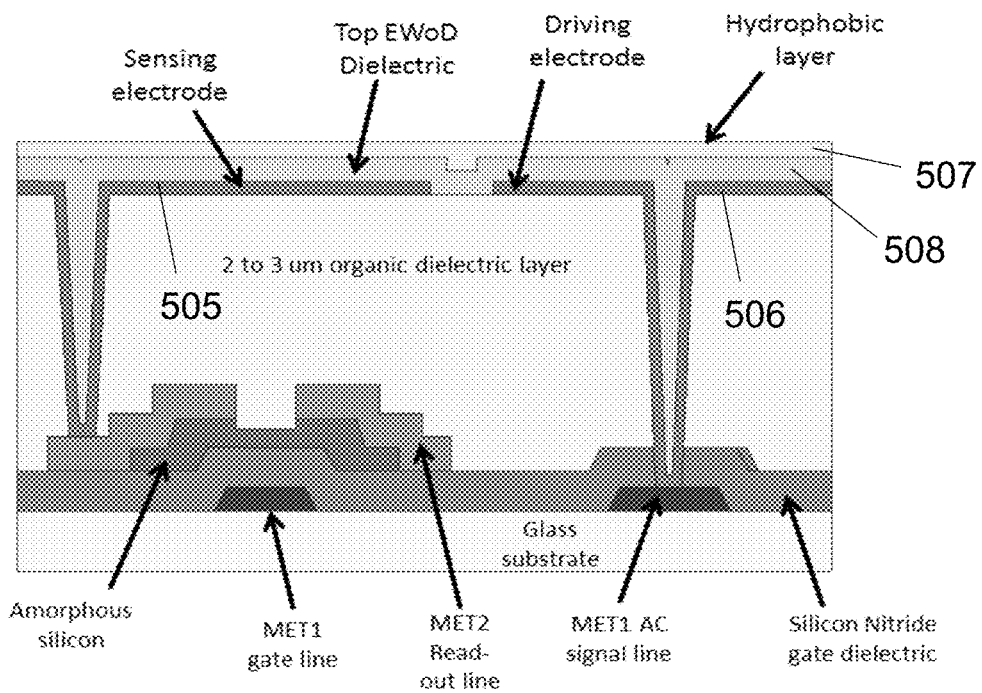
FIG. 5 is a schematic diagram of a portion of the second substrate, including a sensing electrode, a drive electrode, a thin film transistor, a dielectric layer, and a hydrophobic layer.

The architecture of an amorphous silicon sensing layer, including TFT-switched sensing electrodes 505 and drive electrodes 506 is shown in FIG. 5. The AC signal for the driving electrodes runs horizontally and only one line at a time is activated to minimize capacitive coupling to read-out lines and "OFF" sensing electrodes. TFTs are not perfect switches and have some small conductance even in the "OFF" state. This means that a large number of OFF lines can have similar signal to one "ON" pixel. For this reason it is better to minimize capacitive signals from ac voltages above and below the row being driven by only having ac voltages on the row being driven.

As shown in FIG. 6, the sensing and drive electrodes create a coplanar gap cell. One major advantage is that the two plates do not need to be accurately aligned, or even to have the same pixel pitch, thus fabrication of a two plate system is simplified. Additional details of capacitive sensing for droplets using interdigital gap cells can be found in, e.g., "Capacitance Variation Induced by Microfluidic Two-Phase Flow across Insulated Interdigital Electrodes in Lab-On-Chip Devices", T. Dong, C Barbosa, *Sensors*, 15, 2694-2708, (2015), which is incorporated by reference in its entirety. The circuitry for detecting the capacitive signals may include various electrical components, including amplifiers, multiplexing switches. Advanced designs may include an array of a-Si TFTs coupled to a multi-channel charge sensor, such as used for digital x-ray imaging. See, "Front-end electronics for imaging detectors", G. De Geronimo, et al., *Nuclear Instruments and Methods in Physics Research A*, 471 pp. 192-199, (2001), which is incorporated by reference in its entirety.

Figure 7:
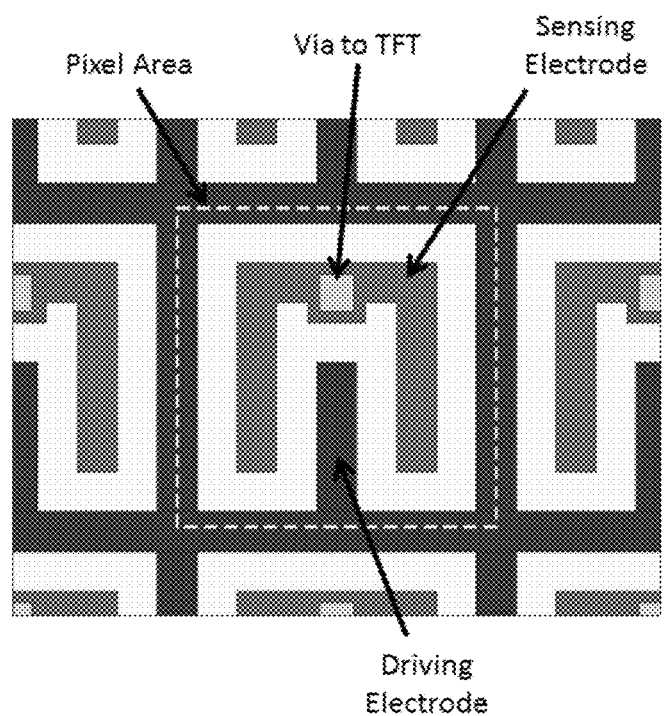
FIG. 7 illustrates an embodiment wherein the sensing electrodes and the drive electrode are interdigitated as part of the second substrate.

In some embodiments, it is unnecessary to provide multiple independent drive electrodes for the AC signal. As shown in FIG. 7, the drive electrode can be arranged to be contiguous, but interdigitated with the sensing electrodes. (All of the electrodes shown in FIG. 7 are in the same metal layer, but are shown in different colors to signify their function.) In FIG. 7, the AC signal is provided to a singular driving electrode that runs horizontally across the surface, while various sensing electrodes are "read" across the array. Typically, only one sensor line at a time is activated to minimize capacitive coupling between the AC signal from the driving electrode and sensing electrodes that are in the "OFF" mode. Without such line-by-line readout, the signal from the numerous sensing electrodes with a "null" state (e.g., coupled to oil) will appear larger than proper, decreasing the signal-to-noise of the correctly sensing electrodes. In an alternative embodiment, the top substrate may include drive electrodes, sensing electrodes, and an earthed grid. The drive and sensing electrodes can be used for droplet sensing, as described above, while the earthed grid provides an electrode surface area opposite the propulsion electrode that has low impedance to electrical ground.

The invention will use circuits coupled to the top drive and sensing electrodes to provide capacitive sensing, thereby allowing the device to track the position of droplets manipulated by the device. However, the signal from capacitive sensing of droplets over a small sensing electrode is also relatively small, thus one to three hundred lines of sensor electrodes may be needed to obtain acceptable signal-to-noise ratios. Providing such a high density of sensing electrodes across the entire device would be expensive and unnecessary. Thus, for larger arrays (such as for combinatorial chemistry) it is preferred to have small localized areas with high densities of sensing pixels on the top plate for particle sizing, with lower density elsewhere for movement sensing.

Figure 8:
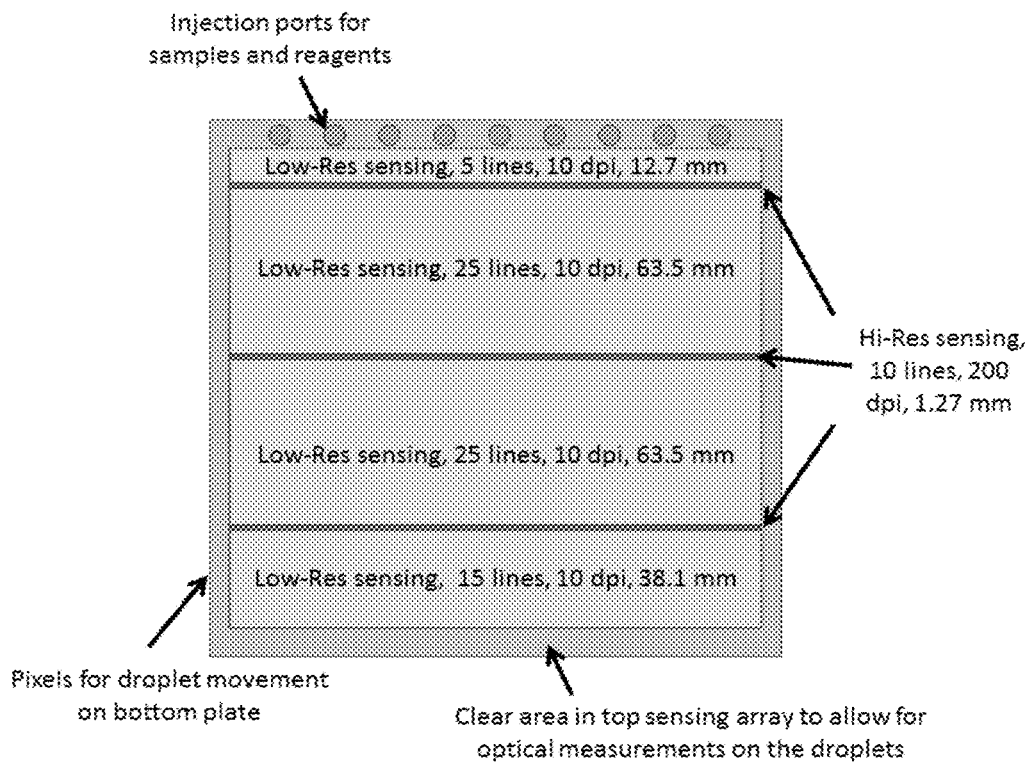
FIG. 8 illustrates a top view of a digital microfluidic device wherein the sensing electrodes are arranged with varying regions of high and low density. The electrode arrangement shown in FIG. 8 provides the necessary functionality (droplet size determination and motion tracking) for many analytical functions while reducing the complexity of the device and the cost of production.

As shown in FIG. 8, an AM-EWoD device can be created with differing densities of sensing electrodes at various locations on the top plate. In the embodiment of FIG. 8, there are 200 dpi high-resolution areas on the array for droplet size measurement, and 10 dpi resolution areas to track droplet movement. In FIG. 8, the sensor would be 181.61 mm wide for 100 measurement lines. If the TFT EWoD propulsion substrate below the sensing plate had a uniform resolution of 200 dpi (electrodes per inch) then there would be 1430 rows of propulsion electrodes for controlling movement, mixing, etc. of droplets. In contrast, a device limited to one hundred sensing rows with a resolution of 180 dpi across the entire device would only be 14.1 mm wide, resulting in only 111 rows of propulsion electrodes; likely too small for complex assays. Thus, by providing differing densities a larger device can be produced with all of the needed sensing capability. In general, a low-resolution area will include between 1 and 15 electrodes per linear centimeter, while a high-resolution area will include between 20 and 200 electrodes per linear centimeter. Typically, the total area (length×width) of sensing electrodes with the lower density (a.k.a., "low-res") is greater than the total area of sensing electrodes with the higher density (a.k.a., "high-res"). For example, there could be three times or greater of the low-res area as compared to the high-res area s compared to the high-res area. For example, there could be five times or greater of the low-res area. For example, there could be ten times or greater of the low-res area as compared to the high-res area.

An additional benefit of using different densities of sensing electrodes is that portions of the top plate can be provided with transparent, or otherwise light-transmissive, areas to allow further interrogation of droplets. For example, fluorescent markers may be observed by illuminating a droplet through the top substrate with a light source and then using a detector and optionally color filters to observe the resulting fluorescence through the top substrate. In other embodiments, the light may pass through both the top and bottom substrates to allow absorption measurements in the IR, UV, or visible wavelengths. Alternatively, attenuated (frustrated) total-internal reflection spectroscopy can be used to probe the contents and or location of droplets in the system.

Figure 9:
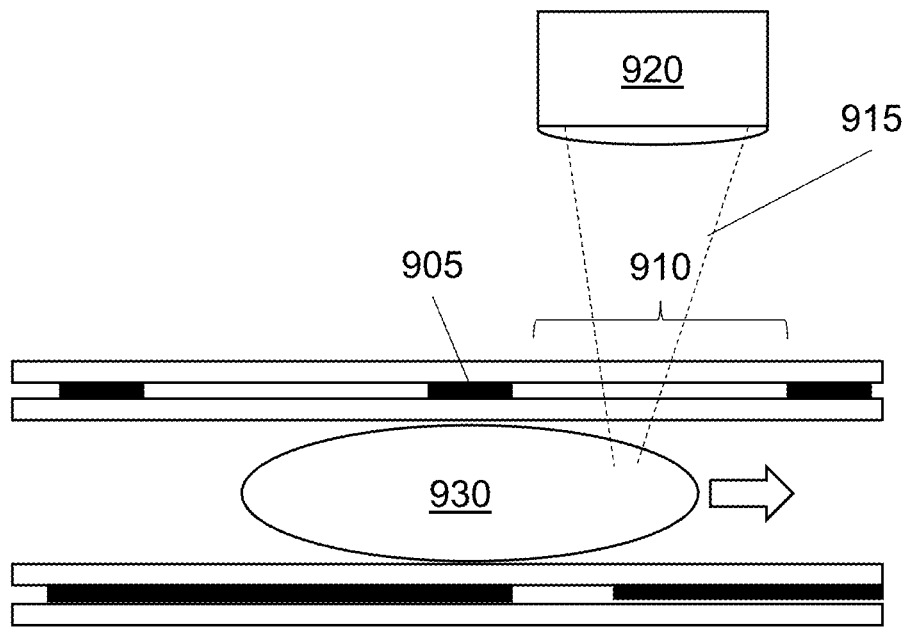
FIG. 9 illustrates an alternate embodiment including a light-transmissive region where droplets can be interrogated with electromagnetic radiation, i.e., light. It is understood that both the probe light and the resulting signal may enter/exit through the same light-transmissive region.

An embodiment of such a system is shown in FIG. 9, wherein a gap 910 between sensing electrodes 905 is on the order of 2 mm, allowing light 915 to pass from an objective 920 to illuminate a passing droplet 930. In an embodiment, the droplet 930 includes fluorescent molecules, and the resulting fluorescent signal is collected back through the objective 920 and split using a dichroic filter (not shown) to be detected with a detector (not shown). Thus, the design allows different types of information, e.g., both capacitive and spectroscopic, to be collected on droplets as they move through the system.

Figure 10:
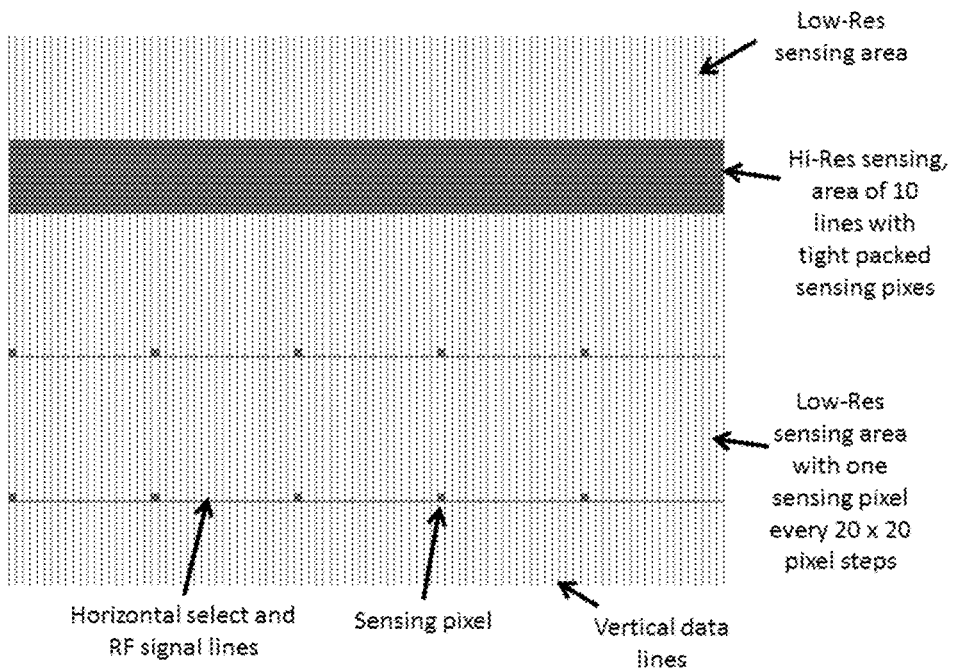
FIG. 10 shows an alternative arrangement of sensing electrodes arranged with varying regions of high and low density.
Figure 11:
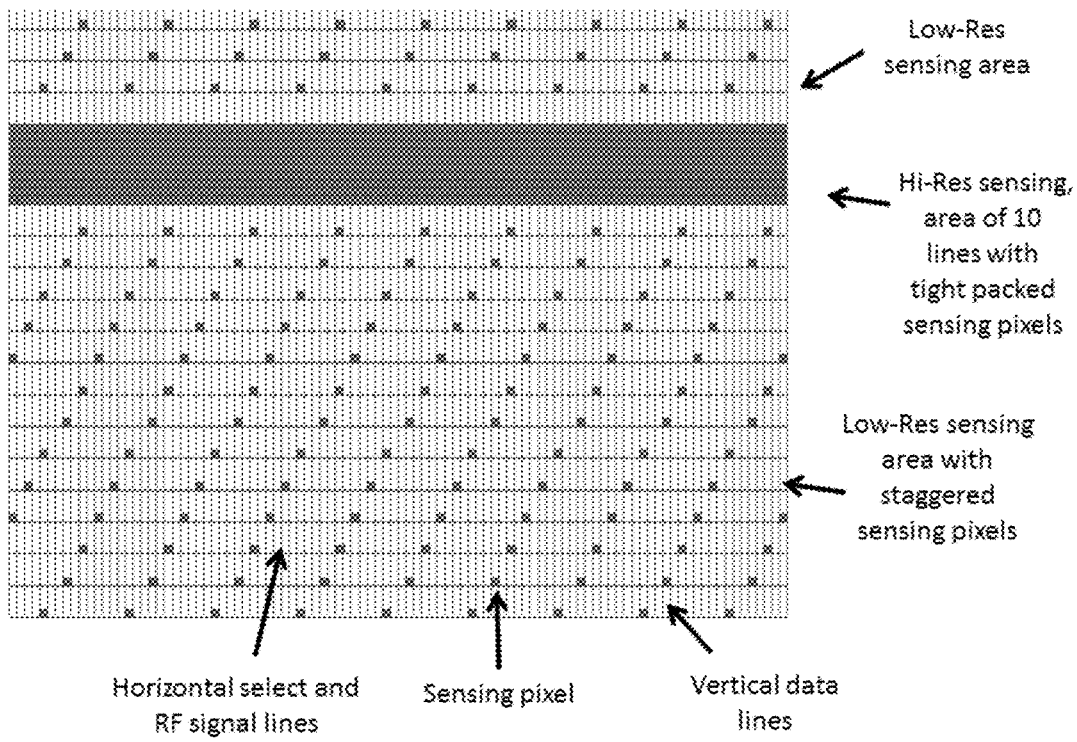
FIG. 11 shows an alternative arrangement of sensing electrodes arranged with varying regions of high and low density.

As discussed with respect to FIG. 8, the simplest way for implementing low resolution sensing would be to have the same sensing pixel design as the high-resolution areas, but have large spaces around the sensing pixel. This concept is illustrated in a different embodiment in FIG. 10. Using the design of FIG. 10, it would be possible for droplets to pass between the low resolution sensing pixels, but a droplet control algorithm could be written to ensure droplets pass over the sensing pixels on a regular basis, allowing the size and composition of the droplets to be monitored. As illustrated in FIG. 10, a uniform distribution of low resolution pixels makes it possible to dramatically increase the area over which sensing is available, while at the same time allowing the use of commercially-available drivers. As an alternative, the number of sensing pixels on any one vertical sensing line can be constant, while the sensing pixels are staggered, as shown in FIG. 11. Other patterns, such as pseudo-random may also be employed to maximize the interaction with the droplets, while reducing the actual number of sensing TFTs that must be fabricated and later addressed.

Figure 12:
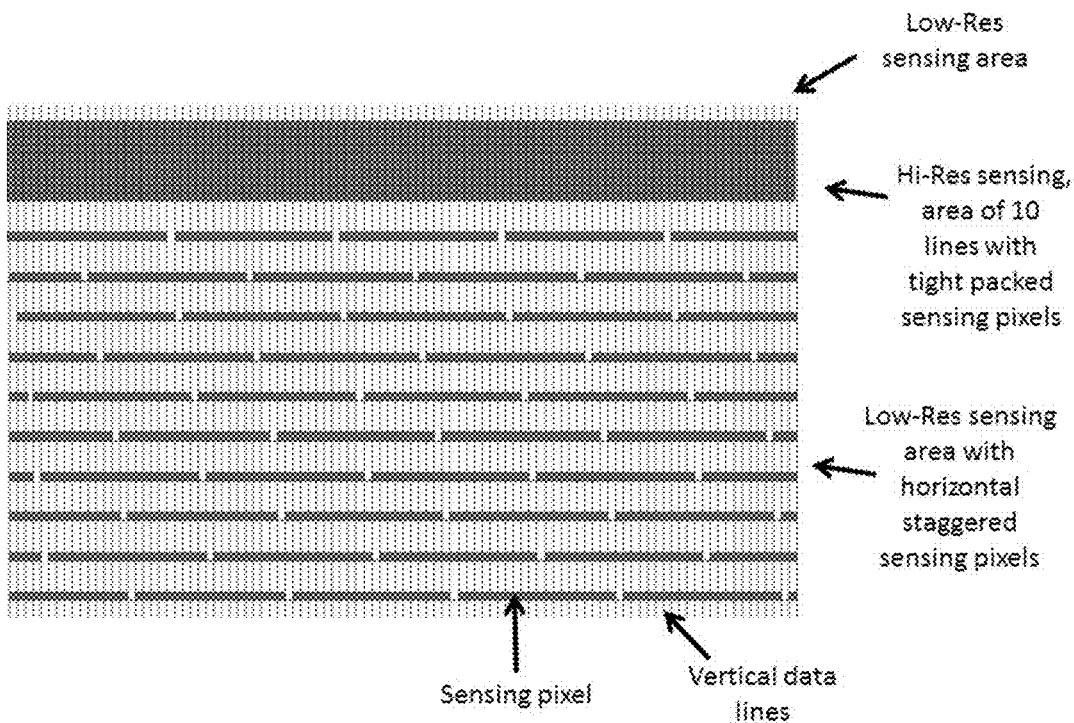
FIG. 12 shows an alternative arrangement including elongated sensing electrodes arranged with varying regions of high and low density.
Figure 13:
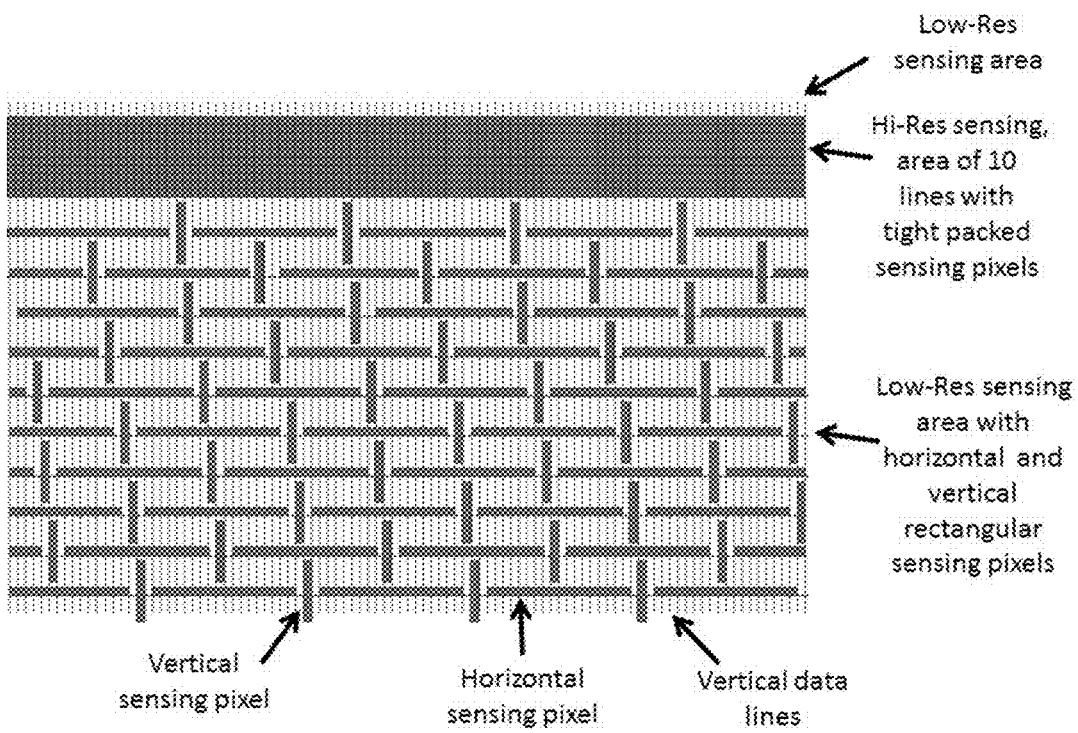
FIG. 13 shows an alternative arrangement including elongated sensing electrodes arranged with varying regions of high and low density.

It is also possible to create low-resolution and high-resolution sensing areas using differently shaped electrodes, as shown in FIGS. 12 and 13. FIG. 12 shows square pixels in the high resolution sensing area and larger rectangular sensing pixels in the low resolution sensing area. This design would be efficient for sensing movement up and down the array, i.e., moving from one elongated electrode to another. This same technique could be implemented to make both horizontal and vertical elongated electrodes that would provide droplet tracking with lower resolution. FIG. 13 shows low resolution area with vertical and horizontal rectangular sensing pixels to detect vertical and horizontal movement of droplets. Other geometric designs, such as spirals can also be used to facilitate location sensing with fewer electrodes and fewer TFTs. As shown in FIGS. 12 and 13, the droplets can be easily moved from the low density regions, where droplet creation, splitting, or mixing take place, to high density regions where size and composition of those droplets can be evaluated.

From the foregoing, it will be seen that the present invention can provide low-cost lab-on-a-chip functionality.

In particular, by using the described architecture, an electrowetting on dielectric system can be created using amorphous-silicon fabrication facilities and lower cost driving electronics. The invention makes efficient use of the available surfaces on both the top and the bottom of the EWoD device, but does not require alignment of the electrodes on the top and bottom surfaces.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A digital microfluidic device, comprising:
a first substrate comprising a first plurality of electrodes coupled to a first set of thin-film-transistors, and including a first dielectric layer covering both the first plurality of electrodes and the first set of thin-film-transistors;
a second substrate comprising a second plurality of electrodes coupled to a second set of thin-film-transistors and a drive electrode, and including a second dielectric layer covering the second plurality of electrodes, the second set of thin-film-transistors, and the drive electrode;
a spacer separating the first and second substrates and creating a microfluidic region between the first and second substrates;
a first controller operatively coupled to the first set of thin-film-transistors and configured to provide a propulsion voltage between at least a portion of the first plurality of electrodes and the drive electrode; and
a second controller operatively coupled to the second set of thin-film-transistors and configured to determine a capacitance between at least one of the second plurality of electrodes and the drive electrode.

2. The digital microfluidic device of claim 1, wherein the first dielectric layer is hydrophobic.

3. The digital microfluidic device of claim 1, wherein the second dielectric layer is hydrophobic.

4. The digital microfluidic device of claim 1, further comprising a first hydrophobic layer covering the first dielectric layer and a second hydrophobic layer covering the second dielectric layer.

5. The digital microfluidic device of claim 1, wherein the first set of thin-film-transistors or the second set of thin-film-transistors comprises amorphous silicon.

6. The digital microfluidic device of claim 1, wherein the first plurality of electrodes are arranged in an array.

7. The digital microfluidic device of claim 6, wherein the array of the first plurality of electrodes includes at least 25 electrodes per linear centimeter.

8. The digital microfluidic device of claim 1, wherein each electrode of the second plurality of electrodes is interdigitated with the drive electrode.

9. The digital microfluidic device of claim 8, further comprising a signal source coupled to the drive electrode and configured to provide a time-varying voltage to the drive electrode.

10. The digital microfluidic device of claim 8, wherein the second plurality of electrodes are between 0.01 and 5 mm in width.

11. The digital microfluidic device of claim 1, wherein the second substrate includes at least one light-transmissive region.

12. The digital microfluidic device of claim 11, wherein the light-transmissive region is at least 10 mm² in area.

13. The digital microfluidic device of claim 1, wherein the second plurality of electrodes are arranged in a first density and a second density, and the first density includes at least three times as many electrodes per 100 mm² as the second density.

14. The digital microfluidic device of claim 13, wherein the first density of the second plurality of electrodes includes between 20 and 200 electrodes per linear centimeter.

15. The digital microfluidic device of claim 13, wherein the second density of the second plurality of electrodes includes between 1 and 15 electrodes per linear centimeter.

16. The digital microfluidic device of claim 13, wherein the area of the device corresponding to the first density is smaller than the area of the device corresponding to the second density.

17. The digital microfluidic device of claim 16, wherein the area of the device corresponding to the second density is at least three times larger than the area of the device corresponding to the first density.

\* \* \* \* \*